(12) United States Patent
Kim et al.

(10) Patent No.: US 11,567,685 B2
(45) Date of Patent: Jan. 31, 2023

(54) STORAGE CONTROLLER AND STORAGE DEVICE INCLUDING THE SAME

(71) Applicant: Samsung Electronics Co., Ltd., Suwon-si (KR)

(72) Inventors: Hwan Kim, Hanam-si (KR); Jea-Young Kwon, Hwaseong-si (KR); Jae-Kun Lee, Suwon-si (KR); Song Ho Yoon, Yongin-si (KR); Sil Wan Chang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/377,901

(22) Filed: Jul. 16, 2021

(65) Prior Publication Data
US 2022/0164123 A1   May 26, 2022

(30) Foreign Application Priority Data

Nov. 20, 2020   (KR) .................. 10-2020-0156774

(51) Int. Cl.
| | |
|---|---|
| *G06F 3/06* | (2006.01) |
| *G06F 11/10* | (2006.01) |
| *G11C 16/10* | (2006.01) |
| *G11C 11/56* | (2006.01) |
| *G11C 16/26* | (2006.01) |

(52) U.S. Cl.
CPC .......... *G06F 3/0647* (2013.01); *G06F 3/0604* (2013.01); *G06F 3/0659* (2013.01); *G06F 3/0673* (2013.01); *G06F 11/1068* (2013.01); *G11C 11/56* (2013.01); *G11C 16/10* (2013.01); *G11C 16/26* (2013.01)

(58) Field of Classification Search
CPC . G06F 3/06; G06F 11/10; G11C 11/56; G11C 16/10; G11C 16/26
See application file for complete search history.

(56) References Cited

U.S. PATENT DOCUMENTS

| | | | |
|---|---|---|---|
| 7,679,133 | B2 | 3/2010 | Son et al. |
| 8,078,794 | B2 | 12/2011 | Lee et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,977,803 | B2 | 3/2015 | Horn et al. |
| 9,158,671 | B2 | 10/2015 | Ryu et al. |
| 10,372,342 | B2 | 8/2019 | Dusija et al. |
| 10,545,685 | B2 | 1/2020 | Tanpairoj et al. |
| 10,698,610 | B2 | 6/2020 | Yang |
| 2011/0233648 | A1 | 9/2011 | Seol et al. |

(Continued)

FOREIGN PATENT DOCUMENTS

CN   107608625 A   1/2018

*Primary Examiner* — Guy J Lamarre
(74) *Attorney, Agent, or Firm* — Harness, Dickey & Pierce, P.L.C.

(57) ABSTRACT

A storage device may include, at least one memory device including at least a first single-level cell (SLC) region, a second SLC region, and at least one multi-level cell (MLC) region, the first SLC region having a higher data read speed than the second SLC region, and the second SLC region having a higher data read speed than the at least one MLC region, and a storage controller configured to control the migration of data among the first SLC region, the second SLC region, and the at least one MLC region.

20 Claims, 7 Drawing Sheets

(56) References Cited

U.S. PATENT DOCUMENTS

| | | | |
|---|---|---|---|
| 2013/0173844 A1* | 7/2013 | Chen | G11C 16/349 |
| | | | 711/E12.008 |
| 2018/0081594 A1* | 3/2018 | Jung | G11C 16/3495 |
| 2019/0317855 A1* | 10/2019 | Prathapan | G11C 7/22 |
| 2019/0384510 A1 | 12/2019 | Chen et al. | |
| 2021/0303203 A1* | 9/2021 | Eliash | G06F 11/1048 |

* cited by examiner

STORAGE CONTROLLER AND STORAGE DEVICE INCLUDING THE SAME

This U.S. non-provisional application claims the benefit of priority under 35 USC § 119 to Korean Patent Application No. 10-2020-0156774, filed on Nov. 20, 2020 in the Korean Intellectual Property Office, the disclosure of which is incorporated herein by reference in its entirety.

BACKGROUND

Various example embodiments of the inventive concepts relate to storage controllers, storage devices including a non-volatile memory including the storage controller, and/or methods of operating the storage controllers, etc.

A flash memory device stores data by changing a threshold voltage of memory cells and reads the data using a desired and/or predetermined read level. Recently, storage devices including flash memory, such as solid-state drive (SSD), a memory card, etc., have been widely used. This is because the flash memory is a nonvolatile device having desired characteristics, such as low power consumption and a high integration degree.

In the flash memory, in order to store write data transmitted from a host, the write data is stored in a memory block of a single-level cell area or a memory block of a multi-level cell area according to characteristics of the write data.

SUMMARY

Various example embodiments of the inventive concepts provide storage controllers having improved performance, systems including the storage controller, and/or operating methods thereof.

Aspects of at least one example embodiment of the inventive concepts provide storage devices in which a storage region is changed according to and/or based on usage characteristics of the data, systems including the storage device, and/or operating methods thereof.

At least one example embodiment of the inventive concepts provide a storage device including a memory device including at least a first single-level cell (SLC) region, a second SLC region, and at least one multi-level cell (MLC) region, the first SLC region having a higher data read speed than the second SLC region, and the second SLC region having a higher data read speed than the at least one MLC region, and a storage controller configured to read data from the memory device and control migration of the data among the first SLC region, the second SLC region, and the at least one MLC region.

At least one example embodiment of the inventive concepts provide an operating method of a storage controller including reading data from a single-level cell (SLC) region of a memory device, and migrating the data to a multi-level cell (MLC) region of the memory device based on a write time order of the data and a read count of the data, the write time order indicating an order that the data was written to the SLC region, and the read count indicating a number of times the data has been read.

At least one example embodiment of the inventive concepts provide a storage controller including processing circuitry configured to, transmit a read request for data stored in one of a first single-level cell (SLC) region, a second SLC region, and a multi-level cell (MLC) region that are included in a memory device, the first SLC region having a higher data read speed than the second SLC region, and the second SLC region having a higher data read speed than the MLC region, and change a storage location of the data in the memory device based on usage characteristics of the data.

It should be noted that the features of the example embodiments of the inventive concepts are not limited thereto and other features related to the example embodiments of the inventive concepts will be apparent to a person of ordinary skill in the art from the following descriptions.

BRIEF DESCRIPTION OF THE DRAWINGS

The above and other aspects and features of the example embodiments of the inventive concepts will become more apparent by describing in detail example embodiments thereof with reference to the attached drawings, in which.

DETAILED DESCRIPTION

Hereinafter, various example embodiments of the inventive concepts will be described with reference to the accompanying drawings.

Figure 1:
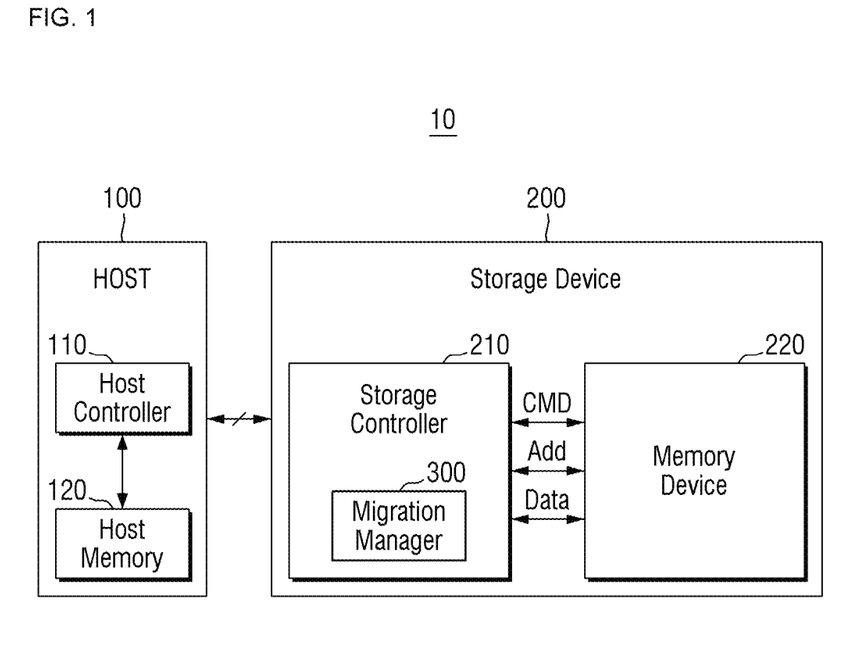
FIG. 1 is a schematic block diagram of a storage system according to some example embodiments.
Figure 2:
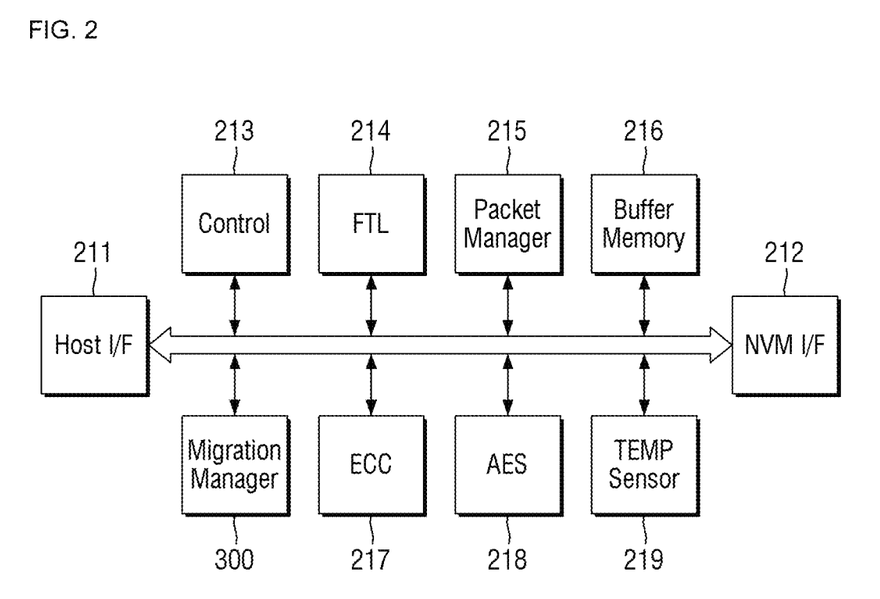
FIG. 2 is a block diagram illustrating a storage controller of FIG. 1 according to at least one example embodiment.
Figure 3:
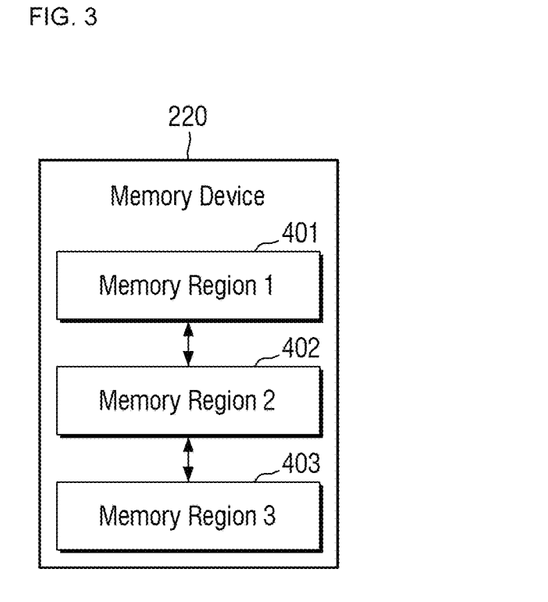
FIG. 3 is a block diagram illustrating a memory device of FIG. 1 according to at least one example embodiment.

FIG. 1 is a schematic block diagram of a storage system according to some example embodiments. FIG. 2 is a block diagram illustrating a storage controller of FIG. 1 in detail. FIG. 3 is a block diagram illustrating a memory device of FIG. 1 in detail according to at least one example embodiment.

Referring to FIG. 1, a host-storage system 10 may include at least one host 100 and/or at least one storage device 200, etc., but the example embodiments are not limited thereto and, for example, the host-storage system 10 may include a greater or lesser number of constituent components, etc. The storage device 200 may include at least one storage controller 210 and/or at least one memory device (e.g., a non-volatile memory (NVM) device 220, etc., but is not limited thereto. According to at least one example embodiment of the inventive concepts, the host 100 (e.g., a host device, an external device, a computing device, a user device, etc.) may include at least one host controller 110 and/or at least one host memory 120, etc. The host memory 120 may function as a buffer memory for temporarily storing data to be transmitted to and/or data transmitted from the storage device 200, but is not limited thereto.

The storage device 200 may include storage media for storing data according to at least one request from the host 100, etc. For example, the storage device 200 may include at least one of a solid-state drive (SSD), an embedded memory, and/or a removable external memory, etc., but is not limited thereto. When the storage device 200 is an SSD, the storage device 200 may be a device conforming to, for example, the non-volatile memory express (NVMe) standard, etc., but the example embodiments are not limited thereto. When the storage device 200 is an embedded memory and/or an external memory, the storage device 200 may be a device conforming to the universal flash storage (UFS) and/or embedded multi-media card (eMMC) standard, but the example embodiments are not limited thereto. The host 100 and the storage device 200 are each capable of generating and/or transmitting at least one packet according to an employed data storage standard protocol.

When the memory device 220 of the storage device 200 includes at least one flash memory, the flash memory may include a two-dimensional (2D) NAND memory array and/or a three-dimensional (3D) (or vertical NAND (VNAND)) memory array. As another example, the storage device 200 may include other types of nonvolatile memories. For example, a magnetic random access memory (MRAM), a spin-transfer torque MRAM, a conductive bridging RAM (CBRAM), a ferroelectric RAM (FeRAM), a phase RAM (PRAM), resistive RAM), and various other types of memories, may be applied as the storage device 200.

According to at least one example embodiment, the host controller 110 and the host memory 120 may be embodied as separate semiconductor chips. Additionally, in some example embodiments, the host controller 110 and the host memory 120 may be integrated on the same semiconductor chip. For example, the host controller 110 may be one of a plurality of modules included in an application processor, and the application processor may be embodied as a system-on-chip (SoC), etc. As another example, the host memory 120 may be an embedded memory provided in the application processor, or a nonvolatile memory or a memory module outside the application processor, etc., but the example embodiments are not limited thereto.

The host controller 110 may manage an operation of storing data (e.g., write data) of the host memory 120 in the memory device 220 and/or retrieving data (e.g., read data) from the memory device 220 in the host memory 120.

The storage controller 210 may include a host interface 211, a memory interface 212, and/or a control unit 213 (e.g., control circuitry, control processing circuitry, etc.), but the example embodiments are not limited thereto. The storage controller 210 may further include a flash translation layer (FTL) 214, a packet manager 215, a buffer memory 216, an error correction code (ECC) engine 217, an advanced encryption standard (AES) engine 218, and/or a migration manager 300, etc., but the example embodiments are not limited thereto, and for example, may include a greater or lesser number of constituent components and/or alternate components, such as omitting the ECC engine 217 and/or AES engine 218, and/or using a different encryption/decryption engine, etc. The storage controller 210 may further include a working memory (not shown) into which the FTL 214 is loaded, and the control unit 213 may execute the FTL 214 to control a data write operation, a data read operation, a data erase operation, a wear leveling operation, etc., with respect to the memory device 220, but the example embodiments are not limited thereto. According to some example embodiments, the storage controller 210 may be implemented as processing circuitry, or in other words, processing circuitry included in the storage controller 210 may be capable of performing the functionality of one or more of the storage controller 210, host interface 211, memory interface 212, control unit 213, FTL 214, packet manager 215, buffer memory 216, ECC engine 217, AES engine 218, and/or a migration manager 300, etc. The processing circuitry may include hardware, such as processors, processor cores, logic circuits, storage devices, etc.; a hardware/software combination such as at least one processor core executing software and/or executing any instruction set, etc.; or a combination thereof. For example, the processing circuitry more specifically may include, but is not limited to, a field programmable gate array (FPGA), a programmable logic unit, an application-specific integrated circuit (ASIC), s System-on-Chip (SoC), etc.

The host interface 211 may transmit a packet to and/or receive a packet from the host 100, etc. A packet transmitted from the host 100 to the host interface 211 may include a command and/or data to be written to the memory device 220, and a packet transmitted from the host interface 211 to the host 100 may include a response to the command and/or the data read from the memory device 220, etc. The memory interface 212 may transmit data, which is to be written to the memory device 220, to the memory device 220, and/or may receive data read from the memory device 220, but is not limited thereto. The memory interface 212 may be implemented to comply with standard conventions such as Toggle and/or ONFI, etc., but the example embodiments are not limited thereto.

The FTL 214 may perform various functions such as address mapping, wear-leveling, and/or garbage collection, etc. Address mapping is an operation of converting a logical address received from the host 100 to a physical address to be used to actually store data in the memory device 220. Wear-leveling is an operation for allowing blocks included in the memory device 220 to be evenly used, thereby decreasing and/or preventing excessive deterioration of a particular block, and may be implemented, for example, by using firmware for balancing erase counts of physical blocks, but the example embodiments are not limited thereto. Garbage collection is an operation for securing usable capacity in the memory device 220 by copying valid data of a current block to a new block and erasing the data stored on the current block, etc.

The packet manager 215 may generate a packet according to a protocol of an interface negotiated with the host 100 and/or parse various types of information from a packet received from the host 100, but the example embodiments are not limited thereto.

The buffer memory 216 may temporarily store data to be written to and/or data read from the memory device 220, etc. The buffer memory 216 may be provided in the storage controller 210 but may be outside and/or external to the storage controller 210, but the example embodiments are not limited thereto.

The ECC engine 217 may perform an error detection and/or correction function on read data read from the memory device 220, but is not limited thereto. More specifically, the ECC engine 217 may generate parity bits with respect to write data to be written to the memory device 220, and the generated parity bits may be stored in the memory device 220 together with the write data, etc. When data is read from the memory device 220, the ECC engine 217 may correct an error in the read data using the parity bits read from the memory device 220 together with the read data, and output the error-corrected read data, etc.

When the storage controller 210 receives data from the memory device 220, the ECC engine 217 may decode the received data to check whether error correction is possible, check and/or determine the number of errors in the received data, and report the number of errors to the migration manager 300 when the error correction is possible. When error correction is not possible, the ECC engine 217 may inform the control unit 213 that the error correction is not possible, and control the data to be read again from the memory device 220 through the control unit 213 (e.g., perform a read retry operation, etc.). The AES engine 218 may perform at least one of an encryption operation and/or a decryption operation with respect to data, which is input to the storage controller 210, using a symmetric-key algorithm, etc., however the example embodiments are not limited thereto, and for example, one or more example embodiments may use a different form of encryption/decryption, etc.

A temperature sensor 219 may sense an operating temperature of the memory device 220. That is, a change in the operating temperature of at least one memory cell of the memory device 220 may be sensed. In some example embodiments, the storage controller 210 may not include the temperature sensor 219 and/or the temperature sensor 219 may be implemented as a part of the memory device 220, etc., but the example embodiments are not limited thereto.

The migration manager 300 may change a data storage location in the memory device 220 according to and/or based on usage characteristics of the data. The changing of the data storage location may be performed during an idle period of an operation performed on the memory device 220, but is not limited thereto. According to some example embodiments, the idle period may be a period in which a background operation of the memory device 220 is performed, but is not limited thereto.

Referring to FIG. 3, the memory device 220 may include a plurality of regions (e.g., memory regions, storage regions, memory chips, etc.), such as regions 401, 402, and 403, etc., classified according to and/or based on a cell level, but the example embodiments are not limited thereto, and for example, the memory device 220 may include greater than three memory regions, less than three memory regions, etc. The plurality of regions 401, 402, and 403, etc., may each include a plurality of memory blocks and may each be managed the same or differently, etc., but the example embodiments are not limited thereto. According to some example embodiments, the region 1 401 may be managed by a first single-level cell (SLC) method, the region 2 402 may be managed by a second SLC method, and the region 3 403 may be a region in which data of 2 bits or more is stored in one cell, etc., but the example embodiments are not limited thereto. The region 3 403 may be managed by, for example, a multi-level cell (MLC) configuration and/or method, a triple level cell (TLC) configuration and/or method, and/or a quad-level cell (QLC) configuration and/or method, etc., but the example embodiments are not limited thereto. According to at least one example embodiment, each of the cells of the MLC, TLC, and/or QLC are capable of storing two or more bits of data in one cell, etc.

For example, an SLC, an MLC, and a TLC may be classified according to the amount of data to be stored in one memory cell. Accordingly, some (e.g., metadata) of the data may be programmed in the region 1 401 and/or the region 2 402, e.g., an SLC region, and the remaining data excluding the metadata may be programmed in the region 3 403, e.g., a non-SLC region, etc., but the example embodiments are not limited thereto.

According to at least one example embodiment, speeds at which a write and/or read operation is performed in the region 1 401 and the region 2 402 are higher than that in the region 3 403. In other words, write operation and/or read operation speeds are faster in SLC regions than in MLC regions, TLC regions, QLC regions, etc. Data that is frequently changed according to a pattern of the host 100 may be stored in the region 1 401 and/or the region 2 402 due to the increased speed of these regions, and data that is not frequently changed may be stored in the region 3 403, but the example embodiments are not limited thereto.

According to some example embodiments, both the region 1 401 and the region 2 402 may be SLC regions, but a speed at which a read operation is performed in the region 1 401 may be set to be higher than the read speed in the region 2 402, but the example embodiments are not limited thereto. That is, a data read speed in the region 1 401 may be higher than the read speed in the region 2 402. Moreover, the data read speed in the region 2 402 may be higher than the data read speed of the non-SLC region, e.g., the region 3 403, etc.

According to some example embodiments, the read operation may be performed in the region 1 401 in desired and/or preset small chunk units, for example, very small data units of about 4 KB or 8 KB, but the example embodiments are not limited thereto. According to some example embodiments, the read operation may be performed in the region 2 402 in units of multiple pages, etc., but the example embodiments are not limited thereto.

When data is read by dividing an SLC region into at least two regions (e.g., the region 1 401 and the region 2 402, etc.) according to and/or based on usage characteristics of the data, the storage controller 210 may read the data at a higher speed while ensuring the reliability of the memory device 220, thereby improving the performance of the storage device 200.

In at least one example embodiment of the inventive concepts, the region 1 401, the region 2 402, and the region 3 403 may be referred to as a first SLC region 401, a second SLC region 402, and an MLC region 403 according to some example embodiments, but are not limited thereto, and may be referred to as a locality queue region 401, a remaining SLC region 402, and an MLC region 403 according to some example embodiments. Or the region 1 401, the region 2 402, and the region 3 403 may be referred to as a fast read SLC region 401, a normal read SLC region 402, and an MLC region 403, etc. It will be apparent that the scope of the example embodiments of the inventive concepts are not limited by the above names.

For reading data at a high speed as described above, the migration manager 300 may change a data storage region of the memory device 220 according to and/or based on usage characteristics of the data. The usage characteristics of the data may include, for example, at least one of a write time when the data is written to the memory device 220, a recent read time, a read count, and/or a data error rate, etc., but the example embodiments are not limited thereto.

According to some example embodiments, the migration manager 300 may maintain data written to the region 1 401 when a write time is less than a migration threshold time THw. That is, the migration manager 300 may migrate the data of the region 1 401 to the region 2 402 and/or the region 3 403 when the data has been written for a long time and/or based on the migration threshold time THw, and/or may maintain the written data in the region 1 401 when the data has not been written for a long time and/or based on the migration threshold time THw, etc.

According to some example embodiments, when a read count of the data in the region 1 401 indicating the number of times that the data has been read (e.g., accessed, etc.) is less than a migration threshold count $TH_{RC}$ (e.g., a read count threshold, etc.), the migration manager 300 may migrate the data to the region 2 402 and/or the region 3 403, etc. That is, the migration manager 300 may maintain the data in the region 1 401 when the data is frequently read (when the read count is large) and/or based on the migration threshold count $TH_{RC}$, and migrate the data from the region 1 401 to the region 2 402 and/or the region 3 403, etc., when the data is hardly read and/or based on the migration threshold count $TH_{RC}$.

According to some example embodiments, the migration manager 300 may even migrate data stored in the region 2 402 and/or the region 3 430 to the region 1 401 when a read count is greater than and/or equal to the migration threshold count $TH_{RC}$, but the example embodiments are not limited thereto.

According to some example embodiments, the migration manager 300 may migrate the data in the region 1 401 and/or the region 2 402 to the region 3 403 according to a write time order (e.g., the order that the data was written, etc.) in which the data is written to the memory device 220. However, when the read count of the data exceeds the migration threshold count $TH_{RC}$, the data which is determined to be currently frequently used data may be maintained in the region 1 401 and/or the region 2 402 without being migrated to the region 3 403, etc., but the example embodiments are not limited thereto. According to at least one example embodiment, a read count may be first considered among a write time and the read count, but the example embodiments are not limited thereto.

According to some example embodiments, data may be stored in the memory region 1 401 when a read count of the data is greater than or equal to a first migration threshold count $TH_{RC1}$, and may be stored in the memory region 2 402 when the read count of the data is less than the first migration threshold count $TH_{RC1}$ but greater than or equal to a second migration threshold count $TH_{RC2}$. In this case, the first migration threshold count $TH_{RC1}$ may be greater than the second migration threshold count $TH_{RC2}$ (e.g., $TH_{RC1} > TH_{RC2}$), but the example embodiments are not limited thereto.

Figure 4:
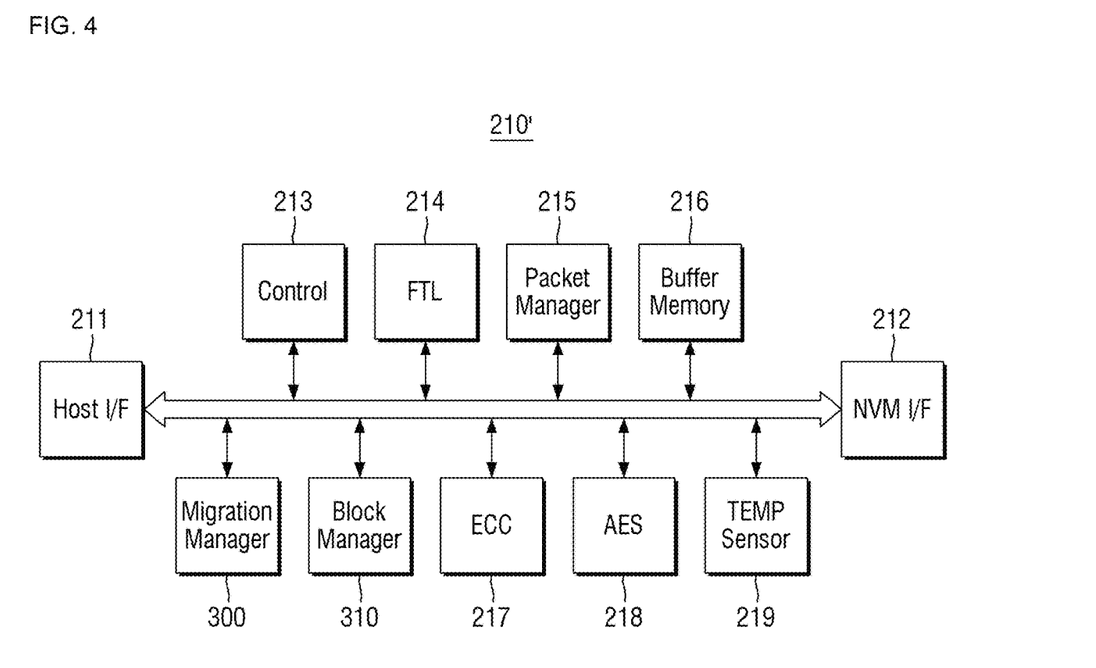
FIG. 4 is a block diagram illustrating a storage controller as shown in FIG. 1 according to at least one example embodiment.
Figure 5:
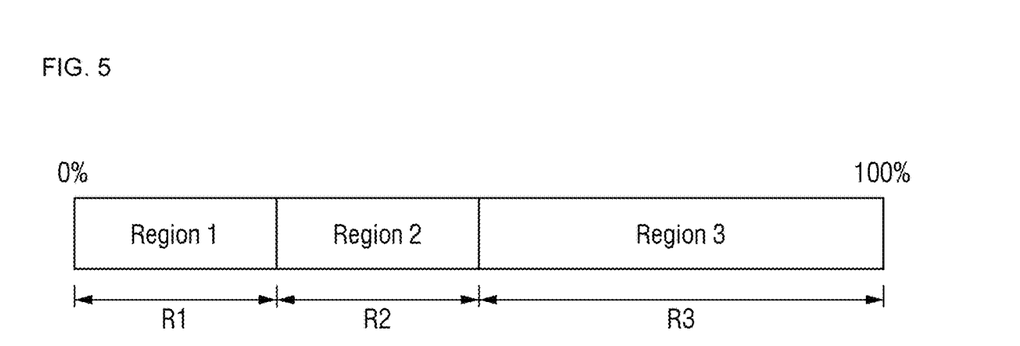
FIG. 5 is a conceptual diagram illustrating dynamic allocation of a storage device as shown in FIG. 3 according to at least one example embodiment.

FIG. 4 is a block diagram illustrating a storage controller as shown in FIG. 1 in detail according to at least one example embodiment. FIG. 5 is a conceptual diagram illustrating dynamic allocation of a storage device as shown in FIG. 3 according to at least one example embodiment. FIGS. 4 and 5 will be described focusing on differences from FIG. 2, and redundant description will be omitted for the sake of brevity and clarity.

Referring to FIGS. 4 and 5, a storage controller 210' may further include a block manager 310, but is not limited thereto. The block manager 310 may statically and/or dynamically allocate sizes of one or more memory regions, such as region 1 401, a region 2 402, and/or a region 3 403, etc., according to an application method.

For example, when a size R1 of the region 1 401 and/or a size R2 of the region 2 402 is large, and a size R3 of the region 3 403 is small, the space utilization rate of the memory device 220 may be reduced and/or inefficient, thus causing a decrease in an overall data storage capacity of the memory device 220. The space utilization rate may be a ratio of a used region to all of the regions, e.g., R1, R2, and R3, etc., (described in FIG. 5).

When the size R1 of the region 1 401 and/or the size R2 of the region 2 402 is small in comparison to a desired storage size and/or in relation to the other regions of a memory device, migration of some piece of data stored in the region 1 401 and/or the region 2 402 to the region 3 403 may more frequently occur to secure an effective space of the region 1 401 and/or the region 2 402, thus causing degradation of the performance of the storage device 200. Therefore, it is desired and/or necessary to appropriately select a size of each of the region 1 401, the region 2, and the region 3 403.

According to some example embodiments, the block manager 310 may dynamically allocate one or more of the regions, e.g., the region 1 401, the region 2 402, and/or the region 3 403, etc., according to and/or based on the data access tendency, data access history and/or data access pattern of the storage device 200. Additionally, according to some example embodiments, the block manager 310 may statically allocate one or more of the regions, e.g., the region 1 401, the region 2 402, and/or the region 3 403, etc., according to and/or based on a user setting (e.g., configuration, etc.) of the storage device 200.

Figure 6:
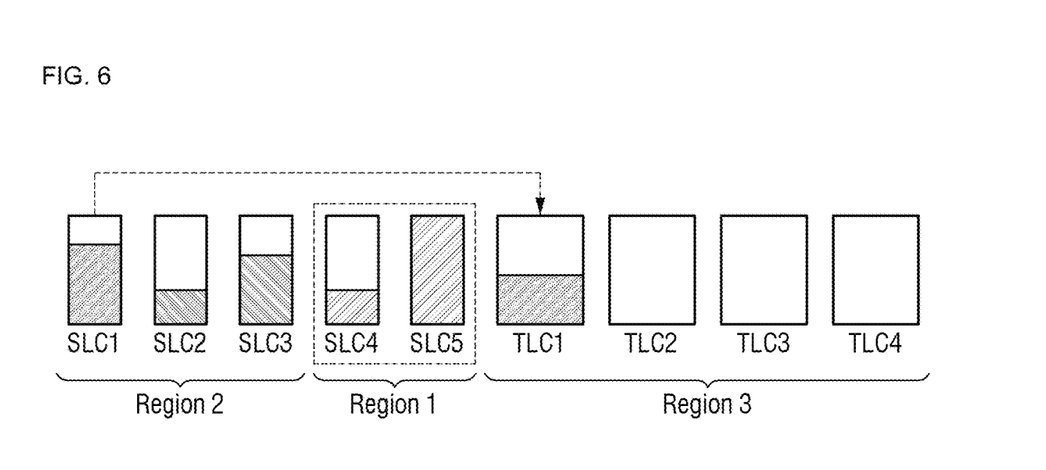
FIG. 6 is a diagram illustrating an operation of a storage system according to some example embodiments.
Figure 7:
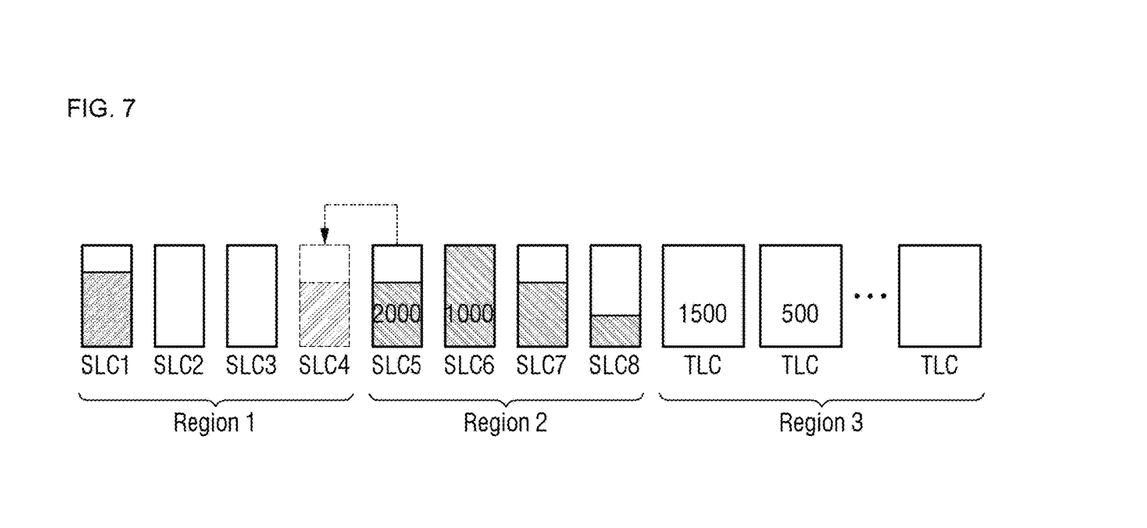
FIG. 7 is a diagram illustrating an operation of a storage system according to some example embodiments.

FIG. 6 is a diagram illustrating an operation of a storage system according to some example embodiments. FIG. 7 is a diagram illustrating an operation of a storage system according to some example embodiments. For the convenience of brevity and clarity, in FIGS. 6 and 7, a first region, a second region, and a third region will be respectively illustrated and described as region 1, region 2, and region 3, but the example embodiments are not limited thereto, and for example, there may be a greater or lesser number of regions used in a memory device, etc.

Referring to FIG. 6, the memory device 220 may be divided into an SLC region including the region 1 410 and the region 2 402, and an MLC region corresponding to the region 3 403 as described above with reference to FIG. 3, but the example embodiments are not limited thereto.

Data may be stored in a write time order in which the data was written to the SLC region, e.g., in the order of SLC1, SLC2, SLC3, SLC4, and SLC5, etc. The data is migrated to the region 3 403 in an order in which the data was written, but the example embodiments are not limited thereto. For example, data of the SLC1 that was written earliest may be migrated first to the third region 403.

However, even if data of an SLC was written earlier, the migration manager 300 may not migrate the data of SLC to the region 3 403, but instead may maintain the data in the region 1 401 and/or the region 2 402 (e.g., the original region), when the data is being frequently read by the storage controller 210. That is, according to some example embodiments, when a read count of data stored in the region 1 401 is greater than or equal to a migration threshold count $TH_{RC}$, the data may be maintained in the region 1 401 by considering the read count over a write time order. For example, when the data of SLC4 is being frequently read, the data of SLC4 is maintained and/or continuously maintained in the region 1 401, even when data is continuously received after SLC 5. According to some example embodiments, the migration manager 300 may first migrate least recently used data to the region 3 403, but the example embodiments are not limited thereto. For example, when a time elapsed from a last read time of data stored in the region 1 401 and/or the region 2 402, etc., (e.g., the SLC regions, etc.) exceeds a migration threshold time $TH_R$, the migration manager 300 may migrate the data to the region 3 403 (e.g., one or more of the non-SLC regions, etc.) from the region 1 401 and/or the region 2 402, etc.

Referring to FIG. 7, according to some example embodiments, the migration manager 300 may migrate data stored in the region 2 402 back to the region 1 401 (e.g., the original region, etc.) when a read count of the data exceeds the migration threshold count $TH_{RC}$. In other words, the migration manager 300 may migrate (e.g., move, etc.) data stored in a first SLC region to a second SLC region when a read count of the data exceeds the migration threshold count $TH_{RC}$, etc. In the illustrated example, when it is assumed that the migration threshold count $TH_{RC}$ is 2000, a read count of data of SLC5 is 2000, e.g., the migration threshold count $TH_{RC}$, the data may be migrated from the region 2 402 to the region 1 401, however the example embodiments are not limited thereto. However, if a read count of data of SLC6 is 1000 and read counts of data of TLC are 1500 and 500, and thus are less than the migration threshold count $TH_{RC}$, the data of SLC6 and TLC may be maintained in Region 2 and Region 3 in which the data has been originally stored, but the example embodiments are not limited thereto.

Similarly, although not shown, data stored in the third region 403 may be migrated back to the region 1 401, etc., when a read count of the data exceeds the migration threshold count $TH_{RC}$.

Figure 8:
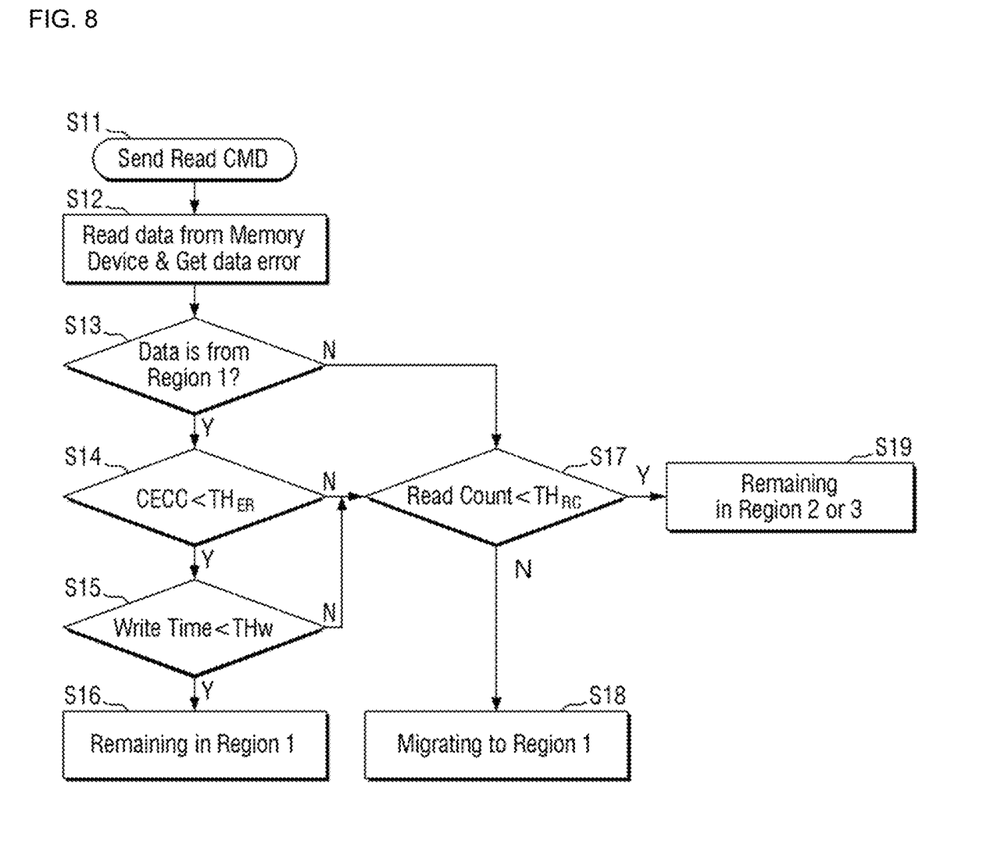
FIG. 8 is a flowchart of an operating method of a storage controller according to some example embodiments.

FIG. 8 is a flowchart of an operating method of a storage controller according to some example embodiments.

Referring to FIG. 8, in operation S11, the storage controller transmits at least one read command to a memory device. In operation S12, when data read from the memory device according to the read command is received, errors in the received data are decoded and the number of the errors is checked, etc.

According to some example embodiments, in operation S13, the storage controller may check whether the read data (hereinafter referred to as the data) has been stored in a SLC region, e.g., the region 1 401, etc. In response to the storage controller determining the data has been stored in a SLC region, e.g., the region 1 401, etc., in operation S14, the number of errors in the data is checked.

When the storage controller determines that the number of errors in the data is less than a desired error threshold $TH_{ER}$, in operation S15, the storage controller checks and/or determines a write time corresponding to when the data was written to the memory device. When the storage controller determines a time elapsed from the write time is less than a migration threshold time $TH_w$, in operation S16, the storage controller maintains the data in the SLC region, e.g., the region 1 401, etc.

When the storage controller determines the number of errors in the data is greater than or equal to the error threshold $TH_{ER}$, in operation S17, the storage controller checks a read count of the data. Additionally, in response to the data not being stored in the region 1 401 (e.g., No in response to operation S13) and the data is stored in the region 2 402 or the region 3 403, etc., the storage controller continuously monitor a read count of the data in operation S17.

When the storage controller determines the read count of the data exceeds a migration threshold count $TH_{RC}$ in operation S17, the storage controller determines the data is still in use and therefore in operation S16 maintains the current storage state is maintained if the data is stored in the region 1 401, and/or the storage controller migrates the data to the region 1 401 when the data is stored in the region 2 402 or the region 3 403 in operation S18. That is, in the case of the data is in use and is frequently read, the data is kept in and/or migrated to the region 1 401, etc., but the example embodiments are not limited thereto.

However, when the storage controller determines the read count of the data is less than a migration threshold count $TH_{TC}$, the storage controller determines the data is not in use and thus in operation S19, the storage controller migrates the data to the region 2 402 or the region 3 403, etc.

Figure 9:
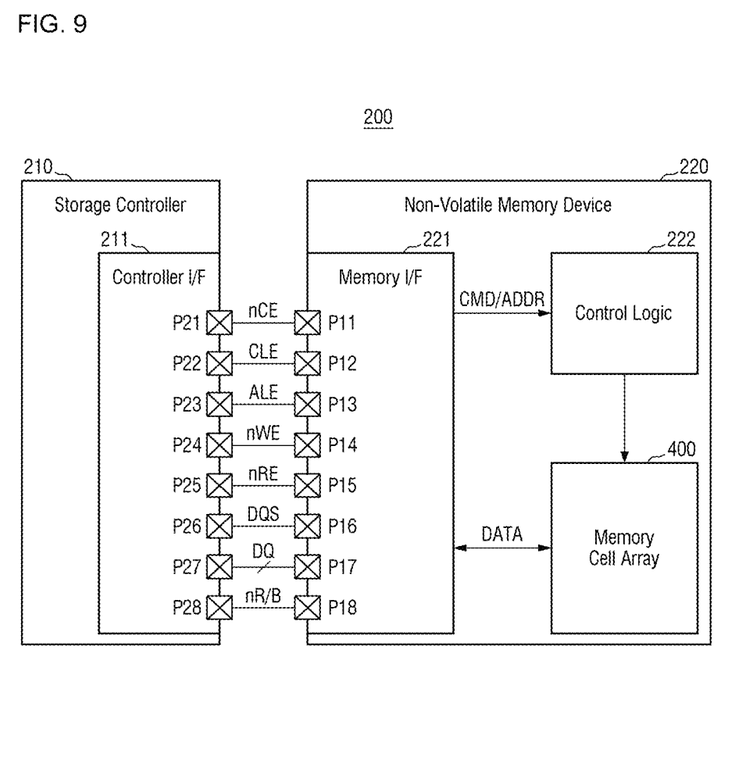
FIG. 9 is a block diagram of a storage system according to at least one example embodiment of the inventive concepts.

FIG. 9 is a block diagram of a storage system according to at least one example embodiment of the inventive concepts. Referring to FIG. 9, a memory device 220 may include a memory device 220 and/or a storage controller 210, etc., but is not limited thereto. The memory device 220 may correspond to one or more of the nonvolatile memory devices NVM11 to NVMmm, etc., communicating with the storage controller 200 on the basis of one of a plurality of channels CH1 to CHm of FIG. 10, but the example embodiments are not limited thereto. The storage controller 210 may correspond to the storage controller 200 of FIG. 1, but is not limited thereto.

According to at least one example embodiment, the memory device 220 may include first to eighth pins P11 to P18, a memory interface circuit 221, a control logic circuit 222, and/or a memory cell array 400, etc.

The memory interface circuit 221 may receive a chip enable signal nCE from the storage controller 210 through the first pin P11, but is not limited thereto. The memory interface circuit 221 may transmit signals to and/or receive signals from the storage controller 210 through the second to eighth pins P12 to P18 according to the chip enable signal nCE, but is not limited thereto. For example, when the chip enable signal nCE is in an enabled state (for example, a low level), the memory interface circuit 221 may transmit signals to and/or receive signals from the storage controller 210 through the second to eighth pins P12 to P18, but the example embodiments are not limited thereto.

The memory interface circuit 221 may receive a command latch enable signal CLE, an address latch enable signal ALE, and/or a write enable signal nWE, etc., from the storage controller 210 through the second to fourth pins P12 to P14, but is not limited thereto. The memory interface circuit 221 may receive a data signal DQ from and/or transmit the data signal DQ to the storage controller 210 through the seventh pin P17, but is not limited thereto. A command CMD, an address ADDR, and/or data, etc., may be transmitted through the data signal DQ. For example, the data signal DQ may be transmitted through a plurality of data signal lines, but is not limited thereto, and for example, may be transmitted serially on a single data signal line. In this case, the seventh pin P17 may include a plurality of pins corresponding to a plurality of data signals.

The memory interface circuit 221 may receive the command CMD from the data signal DQ received during an enable section (e.g., at a high level state) of the command latch enable signal CLE on the basis of toggle timings of the write enable signal nWE, but is not limited thereto. The memory interface circuit 221 may receive the address ADDR from the data signal DQ received during an enable section (e.g., at a high level state) of the address latch enable signal ALE on the basis of the toggle timings of the write enable signal nWE, but is not limited thereto.

In at least one example embodiment, the write enable signal nWE may be maintained at a static state (e.g., a high level or a low level) and thereafter toggled between the high level and the low level, but the example embodiments are not limited thereto. For example, the write enable signal nWE may be toggled in a section in which the command CMD and/or the address ADDR is transmitted. Accordingly, the memory interface circuit 221 may obtain the command CMD and/or the address ADDR on the basis of the toggle timings of the write enable signal nWE, etc.

The memory interface circuit 221 may receive a read enable signal nRE from the storage controller 210 through the fifth pin P15, but is not limited thereto. The memory interface circuit 221 may receive a data strobe signal DQS from and/or transmit the data strobe signal DQS to the storage controller 210 through the sixth pin P16, but is not limited thereto.

In a data DATA output operation of the memory device 220, the memory interface circuit 221 may receive the read enable signal nRE, which is toggling, through the fifth pin P15 before outputting the data DATA, but the example embodiments are not limited thereto. The memory interface circuit 221 may generate a data strobe signal DQS, which is toggling, on the basis of toggling of the read enable signal nRE, but is not limited thereto. For example, the memory interface circuit 221 may generate the data strobe signal DQS that starts toggling after a desired and/or predetermined delay time (e.g., tDQSRE) from a toggling start time of the read enable signal nRE. The memory interface circuit 221 may transmit the data signal DQ including the data DATA on the basis of a toggle timing of the data strobe signal DQS, but is not limited thereto. Accordingly, the data DATA may be aligned with the toggle timing of the data strobe signal DQS and transmitted to the storage controller 210, etc.

In a data DATA input operation of the memory device 220, when the data signal DQ including the data DATA is received from the storage controller 210, the memory interface circuit 221 may receive the data strobe signal DQS, which toggles along with the data DATA, from the storage controller 210. The memory interface circuit 221 may obtain the data DATA from the data signal DQ on the basis of the toggle timing of the data strobe signal DQS, but is not limited thereto. For example, the memory interface circuit 221 may obtain the data DATA by sampling the data signal DQ at a rising edge and a falling edge of the data strobe signal DQS, but the example embodiments are not limited thereto.

The memory interface circuit 221 may transmit a ready/busy output signal nR/B to the storage controller 210 through the eighth pin P18, but is not limited thereto. The memory interface circuit 221 may transmit state information of the memory device 220 to the storage controller 210 through the ready/busy output signal nR/B, etc. When the memory device 220 is in a busy state (i.e., while the internal operations of the memory device 220 are being performed), the memory interface circuit 221 may transmit the ready/busy output signal nR/B indicating the busy state to the storage controller 210, etc. When the memory device 220 is in a ready state (e.g., when the internal operations of the memory device 220 are not performed and/or are completed), the memory interface circuit 221 may transmit the ready/busy output signal nR/B indicating the ready state to the storage controller 210, etc. For example, while the memory device 220 reads the data DATA from the memory cell array 400 in response to a page read command, the memory interface circuit 22 may transmit the ready/busy output signal nR/B indicating the busy state (e.g., a low level) to the storage controller 210, but the example embodiments are not limited thereto. For example, while the memory device 220 is programming the data DATA to the memory cell array 400 in response to a program command, the memory interface circuit 221 may transmit the ready/busy output signal nR/B indicating the busy state to the storage controller 210, etc.

The control logic circuit 222 may generally control various operations of the memory device 220. The control logic circuit 222 may receive the command CMD and/or address ADDR signal obtained by the memory interface circuit 221. The control logic circuit 222 may generate control signals for controlling other components of the memory device 220 according to and/or based on the received command CMD and/or address ADDR signal. For example, the control logic circuit 222 may generate various control signals for programming the data DATA to and/or reading the data DATA from the memory cell array 400, etc.

The memory cell array 400 may store the data DATA obtained from the memory interface circuit 221 under the control of the control logic circuit 222, but the example embodiments are not limited thereto. The memory cell array 400 may output the stored data DATA to the memory interface circuit 221 under the control of the control logic circuit 222, but is not limited thereto.

The memory cell array 400 may include a plurality of memory cells. For example, the plurality of memory cells may be flash memory cells. However, the example embodiments of the inventive concepts are not limited thereto, and the memory cells may be resistive random access memory (RRAM) cells, ferroelectric RAM (FRAM) cells, phase-change RAM (PRAM) cells, thyristor RAM (TRAM) cells, and/or magnetic RAM (MRAM) cells, etc. Some example embodiments of the inventive concepts will be described below with respect to example embodiments in which memory cells are NAND flash memory cells, but the example embodiments are not limited thereto.

The storage controller 210 may include a plurality of pins, e.g., first to eighth pins P21 to P28, etc., and at least one controller interface circuit 211, etc. The first to eighth pins P21 to P28 may correspond to the first to eighth pins P11 to P18 of the memory device 220, but are not limited thereto.

The controller interface circuit 410 may transmit the chip enable signal nCE to the memory device 220 through the first pin P21, but is not limited thereto. The controller interface circuit 410 may transmit signals to and/or receive signals from the memory device 220, which is selected by the chip enable signal nCE, through the second to eighth pins P22 to P28, but the example embodiments are not limited thereto.

The controller interface circuit 410 may transmit the command latch enable signal CLE, the address latch enable signal ALE, and/or the write enable signal nWE to the memory device 220 through the second to fourth pins P22 to P24, but is not limited thereto. The controller interface circuit 410 may transmit the data signal DQ to and/or receive the data signal DQ from the memory device 220 through the seventh pin P27, but is not limited thereto.

The controller interface circuit 410 may transmit the data signal DQ including the command CMD and/or the address ADDR to the memory device 220, together with the write enable signal nWE that toggles, but the example embodiments are not limited thereto. The controller interface circuit 410 may transmit the command latch enable signal CLE that is in the enabled state to transmit the data signal DQ including the command CMD to the memory device 220, and transmit the address latch enable signal ALE that is in the enabled state to transmit the data signal DQ including the address ADDR to the memory device 220, etc.

The controller interface circuit 410 may transmit the read enable signal nRE to the memory device 220 through the fifth pin P25, but is not limited thereto. The controller interface circuit 410 may receive the data strobe signal DQS from and/or transmit the data strobe signal DQS from the memory device 220 through the sixth pin P26, but is not limited thereto.

In a data DATA output operation of the memory device 220, the controller interface circuit 410 may generate the read enable signal nRE that toggles and transmit the read enable signal nRE to the memory device 220, but is not limited thereto. For example, the controller interface circuit 410 may generate the read enable signal nRE that changes from a static state (e.g., a high level or a low level) to a toggle state before the data DATA is output, but the example embodiments are not limited thereto. Accordingly, the memory device 220 may generate the data strobe signal DQS that toggles based on the read enable signal nRE. The controller interface circuit 410 may receive the data signal DQ including data DATA from the memory device 220, together with the data strobe signal DQS that toggles. The controller interface circuit 410 may obtain the data DATA from the data signal DQ on the basis of the toggle timing of the data strobe signal DQS, but the example embodiments are not limited thereto.

In a data DATA input operation of the memory device 220, the controller interface circuit 410 may generate the data strobe signal DQS that toggles, etc. For example, the controller interface circuit 410 may generate the data strobe signal DQS that changes from a static state (e.g., a high level or a low level) to a toggle state before the data DATA is transmitted, but is not limited thereto. The controller interface circuit 410 may transmit the data signal DQ including the data DATA to the memory device 220 on the basis of toggle timings of the data strobe signal DQS, etc.

The controller interface circuit 410 may receive the ready/busy output signal nR/B from the memory device 220 through the eighth pin P28, but is not limited thereto. The controller interface circuit 410 may identify state information of the memory device 220 on the basis of the ready/busy output signal nR/B, etc.

The storage device 200 may transmit a read command through a data bus DQ, and may check whether the memory device 220 is ready to perform a read operation on the basis of the ready/busy output signal nR/B, but is not limited thereto. When the memory device 220 is ready to perform the read operation, the storage device 200 may output data read from the memory cell array 400 through the data bus DQ, etc. That is, the storage device 200 may check whether the read data was read from a first region (e.g., a locality queue region) and/or a remaining region, based on a time interval from the transmission of the read command to the outputting of the ready/busy output signal nR/B and a signal through the data bus DQ, etc.

The memory device 200 may support the plurality of channels CH1 to CHm, and the memory device 220 and/or the storage controller 210 may be connected through the plurality of channels CH1 to CHm, etc. For example, the memory device 200 may be embodied as a storage device such as a solid-state drive (SSD), but is not limited thereto.

The memory device 220 may include a plurality of nonvolatile memory devices. Each of the nonvolatile memory devices may be connected to one of a plurality of channels through a corresponding way, etc. For example, the nonvolatile memory devices may be connected to a first channel through ways and are connected to a second channel through ways, but is not limited thereto. In at least one example embodiment, each of the nonvolatile memory devices may be embodied as a memory unit capable of operating according to an individual command from the storage controller 210, but is not limited thereto. For example, each of the nonvolatile memory devices may be embodied as a chip or a die but the inventive concepts is not limited thereto.

Figure 10:
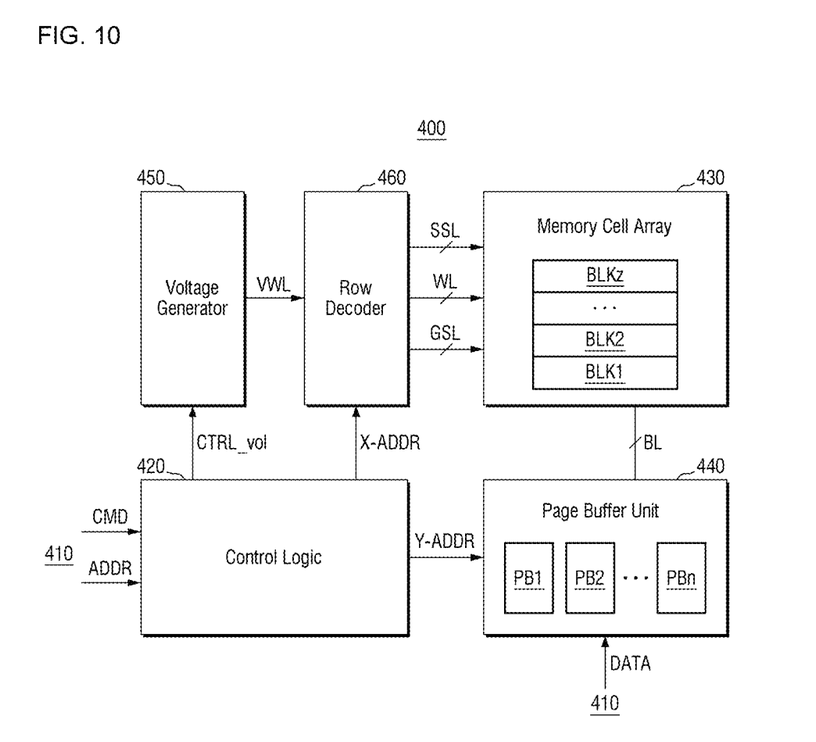
FIG. 10 is a block diagram of an example of the memory device 220 of FIG. 1 according to at least one example embodiment.

FIG. 10 is a block diagram of an example of the memory device 220 of FIG. 1 according to at least one example embodiment. Referring to FIG. 10, a memory device 400 may include a control logic circuit 420, a memory cell array 430, a page buffer unit 440, a voltage generator 450, and/or a row decoder 460, etc., but is not limited thereto. The memory device 400 may further include the memory interface circuit 410 and may further include a column logic, a pre-decoder, a temperature sensor, a command decoder, an address decoder, and the like. According to some example embodiments, the control logic circuit 420 may be implemented as processing circuitry, or in other words, processing circuitry included in the control logic circuit 420 may be capable of performing the functionality of one or more of the control logic circuit 420, memory cell array 430, page buffer unit 440, voltage generator 450, row decoder 460, memory interface circuit 410, etc. The processing circuitry may include hardware, such as processors, processor cores, logic circuits, storage devices, etc.; a hardware/software combination such as at least one processor core executing software and/or executing any instruction set, etc.; or a combination thereof. For example, the processing circuitry more specifically may include, but is not limited to, a field programmable gate array (FPGA), a programmable logic unit, an application-specific integrated circuit (ASIC), s System-on-Chip (SoC), etc.

The control logic circuit 420 may generally control various operations in the memory device 400. The control logic circuit 420 may output various control signals in response to a command CMD and/or an address ADDR signal from the memory interface circuit 410. For example, the control logic circuit 420 may output a voltage control signal CTRL_vol, a row address X-ADDR, and/or a column address Y-ADDR, etc.

The memory cell array 430 may include a plurality of memory blocks BLK1 to BLKz (z is a positive integer), and each of the plurality of memory blocks BLK1 to BLKz may include a plurality of memory cells. The memory cell array 430 may be connected to the page buffer unit 440 through bit lines BL, and connected to the row decoder 460 through word lines WL, string selection lines SSL, and/or ground selection lines GSL, etc.

In at least one example embodiment, the memory cell array 430 may include a 3D memory cell array, and the 3D memory cell array may include a plurality of NAND strings. Each of the NAND strings may include memory cells connected to the word lines vertically stacked on a substrate. U.S. Pat. Nos. 7,679,133, 8,553,466, 8,654,587, 8,559,235, and US Application No. 2011/0233648, are incorporated herein by reference in their entireties. In at least one example embodiment, the memory cell array 430 may include a 2D memory cell array and the 2D memory cell array may include a plurality of NAND strings arranged in row and column directions, etc.

The page buffer unit 440 (e.g., page buffer, page buffer circuitry, etc.) may include a plurality of page buffers PB1 to PBn (n is an integer greater than or equal to 3), and the plurality of page buffers PB1 to PBn may be connected with the memory cells through the bit lines BL. The page buffer unit 440 may select at least one of the bit lines BL in response to the column address Y-ADDR. The page buffer unit 440 may operate as a write driver and/or a sense amplifier according to an operating mode. For example, during a program operation, the page buffer unit 440 may apply a bit line voltage corresponding to data to be programmed to a selected bit line. During a read operation, the page buffer unit 440 may sense data stored in a memory cell by sensing a current and/or voltage of a selected bit line.

The voltage generator 450 may generate various types of voltages for performing the program operation, the read operation, an erase operation, etc. on the basis of the voltage control signal CTRL_vol. For example, the voltage generator 450 may generate a program voltage, a read voltage, a program-verify voltage, an erase voltage, or the like, as a word line voltage VWL, etc.

The row decoder 460 may select one of the word lines WL and one of the string selection lines SSL in response to the row address X-ADDR. For example, the row decoder 460 may apply the program voltage and/or the program-verify voltage to the selected word line during the program operation, and apply the read voltage to the selected word line during the read operation, but is not limited thereto.

Figure 11:
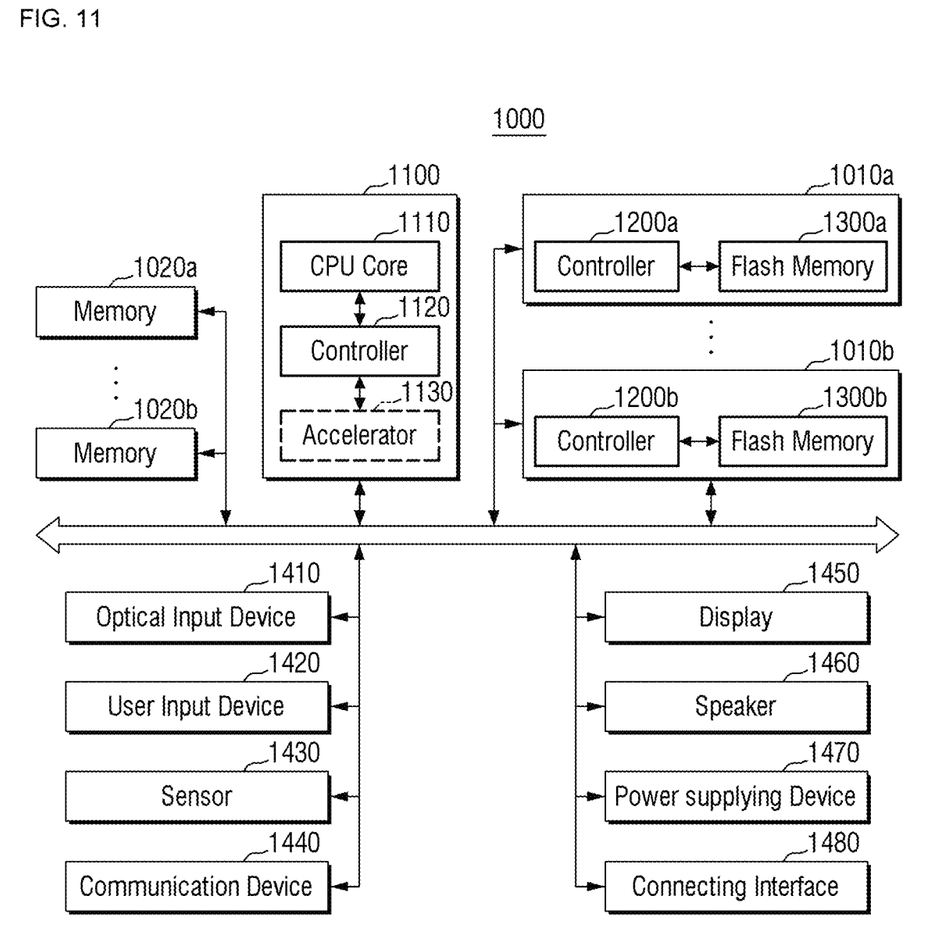
FIG. 11 is a diagram illustrating a system to which the storage device 200 of FIG. 1 is applied according to at least one example embodiment.

FIG. 11 is a diagram illustrating a system to which the storage device 200 of FIG. 1 is applied according to at least one example embodiment.

A system 1000 of FIG. 11 according to at least one example embodiment may be a mobile system such as a mobile phone, a smart phone, a tablet, a personal computer (PC), a wearable device, a healthcare device, and/or an Internet-of-things (IoT) device, etc., but is not limited thereto. However, the system 1000 of FIG. 11 is not necessarily limited to the mobile system, and may be a laptop computer, a server, a media player, and/or an automotive device such as a navigation system, etc.

Referring to FIG. 11, the system 1000 may include a main processor 1100, memories 1020a and 1020b, and storage devices 1010a and 1010b, and may further include at least one of an image capturing device 1410, a user input device 1420, a sensor 1430, a communication device 1440, a display 1450, a speaker 1460, a power supply device 1470, and/or a connection interface 1480, etc.

The main processor 1100 may control overall operations of the system 1000, and more specifically, operations of other components of the system 1000. The main processor 1100 may be embodied as a general-purpose processor, a dedicated processor, an application processor, or the like.

The main processor 1100 may include one or more control unit cores 1110, and may further include a controller 1120 for controlling the memories 1020a and 1020b and/or the storage devices 1010a and 1010b, etc. According to at least one example embodiment, the main processor 1100 may further include an accelerator block 1130, which is a dedicated circuit for high-speed data operation such as an artificial intelligence (AI) data operation, etc., but is not limited thereto. The accelerator block 1130 may include a graphics processing unit (GPU), a neural processing unit (NPU), and/or a data processing unit (DPU), etc., and may be embodied as a chip physically independent from the other components of the main processor 1100, but is not limited thereto.

The memories 1020a and 1020b may be used as main memory devices of the system 1000, and may include volatile memories such as a SRAM and/or DRAM but may include nonvolatile memories such as flash memory, PRAM and/or RRAM, etc. The memories 1020a and 1020b may be implemented in the same package as the main processor 1100, but is not limited thereto.

The storage devices 1010a and 1010b may function as nonvolatile storage devices that store data regardless of whether power is supplied or not, and may have a relatively larger storage capacity than the memories 1200a and 1200b. The storage devices 1010a and 1010b may include storage controllers 1200a and 1200b, and non-volatile memory (NVM) storages 1300a and 1300b that store data under control of the storage controllers 1200a and 1200b, but the example embodiments are not limited thereto. The NVM storage 1300a and 1300b may include 2D and/or 3D V-NAND flash memories but may include other types of NVMs such as a PRAM and/or RRAM, etc.

The storage devices 1010a and 1010b may be included in the system 1000 to be physically separated from the main processor 1100 or may be included in the same package as the main processor 1100. Additionally, the storage devices 1010a and 1010b may have the same shape as a memory card and thus may be detachably coupled with the other components of the system 1000 through an interface such as the connection interface 1480 to be described below. The storage devices 1010a and 1010b may be devices to which standard conventions such as universal flash storage (UFS) are applied but are not limited thereto.

The image capturing device 1410 may capture a still image or a moving picture (e.g., video, etc.) and may include a camera, a camcorder, and/or a webcam, etc.

The user input device 1420 may receive various types of data input from a user of the system 1000 and may include a touch pad, a keypad, a keyboard, a mouse, and/or a microphone, etc.

The sensor 1430 may detect various types of physical quantities that may be obtained from the outside of the system 1000 and convert the detected physical quantities into electrical signals. The sensor 1430 may include a temperature sensor, a pressure sensor, an illuminance sensor, a position sensor, an acceleration sensor, a biosensor, and/or a gyroscope, etc.

The communication device 1440 may perform transmission and reception of signals with other devices outside the system 1000 according to various communication protocols. The communication device 1440 may include an antenna, a transceiver, and/or a modem, etc.

The display 1450 and the speaker 1460 may function as output devices that output visual information and audio information to a user of the system 1000.

The power supply device 1470 may appropriately convert power supplied from a battery (not shown) built in the system 1000 and/or an external power supply and supply the converted power to each component of the system 1000.

The connection interface 1480 may connect the system 1000 and an external device, which may exchange data with the system 1000 when connected to the system 1000. The connection interface 1480 may be implemented according to various interface methods, such as advanced technology attachment (ATA), serial ATA (SATA), external SATA (e-SATA), small-computer small-interface (SCSI), serial attached SCSI (SAS), peripheral component interconnection (PCI), PCI express (PCIe), NVM express (NVMe), IEEE 1394, Universal Serial Bus (USB), a secure digital (SD) card, a multi-media card (MMC), an embedded multi-media card (eMMC), universal flash storage (UFS), embedded UFS (eUFS), a compact flash (CF) card interface, and the like.

Although various example embodiments of the inventive concepts have been described above with reference to the accompanying drawings, the inventive concepts are not limited thereto and may be embodied in various different forms. It will be understood by those of ordinary skill in the art that the example embodiments of the inventive concepts may be implemented in other specific forms without departing from the technical spirit or essential features of the inventive concepts. Accordingly, the example embodiments set forth herein should be considered only as examples and not for purposes of limitation.

What is claimed is:

1. A storage device comprising:
a memory device including at least a first single-level cell (SLC) region, a second SLC region, and at least one multi-level cell (MLC) region, the first SLC region including a first set of SLC memory cells, the second SLC region including a second set of SLC memory cells, and the at least one MLC region including at least one set of MLC memory cells, the first SLC region having a higher data read speed than the second SLC region, and the second SLC region having a higher data read speed than the at least one MLC region; and
a storage controller configured to,
read data from the memory device and control migration of the data among the first SLC region, the second SLC region, and the at least one MLC region, the controlling the migration of the data includes,
maintaining the data stored in the first SLC region in response to a read count of the data stored in the first SLC region being greater than a desired threshold read count, and
migrating the data stored in the first SLC region to the second SLC region or the at least one MLC region in response to the read count of the data stored in the first SLC re ion being less than or equal to the desired threshold read count or a write time of the data stored in the first SLC region being greater than a desired threshold write time.

2. The storage device of claim 1, wherein the storage controller is further configured to:
control the migration of the data among the first SLC region, the second SLC region, and the MLC region based on characteristics of the data.

3. The storage device of claim 2, wherein the characteristics of the data comprise at least one of:
a write time of the data programmed to the memory device, a read count of the data, or any combinations thereof.

4. The storage device of claim 3, wherein the storage controller is further configured to:
migrate the data stored on the second SLC region or the MLC region to the first SLC region in response to a number of errors included in the data being less than an error threshold, and a write time of the data being less than a migration threshold time.

5. The storage device of claim 3, wherein the storage controller is further configured to:
maintain the data stored on the second SLC region or the MLC region in response to a number of errors included in the data being greater than or equal to an error threshold, and a read count of the data being less than a migration threshold count.

6. The storage device of claim 3, wherein the storage controller is further configured to:
in response to the read count of the data being greater than or equal to a migration threshold count,
migrating the data stored in the second SLC region or the MLC region to the first SLC region, and
maintaining the data stored in the first SLC region.

7. The storage device of claim 1, wherein the storage controller is further configured to:
dynamically adjust sizes of the first SLC region, the second SLC region, and the MLC region of the memory device based on a data access pattern of the storage controller.

8. The storage device of claim 1, wherein the MLC region comprises at least one of a multi-level cell, a triple-level cell, a quad-level cell, or any combinations thereof.

9. An operating method of a storage controller, comprising:
reading data from a single-level cell (SLC) region of a memory device, the SLC region including a set of SLC memory cells; and
migrating the data to a multi-level cell (MLC) region of the memory device based on a write time order of the data and a read count of the data, the write time order indicating an order that the data was written to the SLC region, and the read count indicating a number of times the data has been read, the MLC region including set of MLC memory cells, the migrating the data including,
maintaining the data stored in the SLC region in response to a read count of the data stored in the SLC re ion being eater than a desired threshold read count, and
migrating the data stored in the SLC region to the MLC region in response to the read count of the data stored in the SLC region being less than or equal to the desired threshold read count or a write time of the data stored in the SLC region being greater than a desired threshold write time.

10. The operating method of claim 9, wherein
the SLC region further includes a locality queue region, the locality queue region including a second of SLC memory cells; and
the method further comprises,
storing the data in the locality queue region based on characteristics of the data.

11. A storage controller comprising:
processing circuitry configured to,
transmit a read request for data stored in one of a first single-level cell (SLC) region, a second SLC region, and a multi-level cell (MLC) region that are included in a memory device, the first SLC region including a first set of SLC memory cells, the second SLC region including a second set of SLC memory cells, and the MLC region including a set of MLC memory cells, the first SLC region having a higher data read speed than the second SLC region, and the second SLC region having a higher data read speed than the MLC region; and
change a storage location of the data in the memory device based on usage characteristics of the data, the changing the storage location including,
maintaining the data stored in the first SLC region in response to a read count of the data stored in the first SLC region being greater than a desired threshold read count, and
migrating the data stored in the first SLC region to the second SLC region or the MLC region in response to the read count of the data stored in the first SLC region being less than or equal to the desired threshold read count or a write time of the data stored in the first SLC region being greater than a desired threshold write time.

12. The storage controller of claim 11, wherein the processing circuitry is further configured to:
receive the data from the memory device in response to the read request;

correct errors in the received data received and determine a number of errors included in the received data; and
change the storage location of the received data based on the determined number of errors.

13. The storage controller of claim 12, wherein the processing circuitry is further configured to:
in response to the received data not being correctable, transmit a second read request of the data to the memory device.

14. The storage controller of claim 11, wherein the usage characteristics of the data comprise at least one of a write time of the data, a recent read time, a read count, an error rate, or any combinations thereof.

15. The storage controller of claim 14, wherein the processing circuitry is further configured to:
migrate the data from the first SLC region to the second SLC region or the MLC region in response to the read count being less than a migration threshold count.

16. The storage controller of claim 14, wherein the processing circuitry is further configured to:
in response to the storage location of the data being the first SLC region and a write time of the data being less than a migration threshold time, maintaining the storage location of the data in the first SLC region.

17. The storage controller of claim 11, wherein the processing circuitry is further configured to:
in response to the storage location of the data not being the first SLC region, migrate the data to the first SLC region based on a read count of the data being greater than or equal to a migration threshold count.

18. The storage controller of claim 11, wherein the processing circuitry is further configured to:
migrate data of the first SLC region or the second SLC region to the MLC region based on a write time order of the data.

19. The storage controller of claim 18, wherein the processing circuitry is further configured to:
in response to a read count of the data exceeding a migration threshold count, migrate the data to the first SLC region.

20. The storage controller of claim 11, wherein the processing circuitry is further configured to:
dynamically adjust sizes of the first SLC region, the second SLC region, and the MLC region based on a data access pattern.

* * * * *